US009947274B2

United States Patent
Park et al.

(10) Patent No.: US 9,947,274 B2
(45) Date of Patent: Apr. 17, 2018

(54) GATE DRIVER AND DISPLAY DEVICE HAVING THE SAME

(71) Applicant: Samsung Display Co., Ltd., Yongin-si, Gyeonggi-do (KR)

(72) Inventors: Jun-Hyun Park, Suwon-si (KR); Sung-Hwan Kim, Yongin-si (KR); Kyoung-Ju Shin, Hwaseong-si (KR); Sang-Uk Lim, Yongin-si (KR); Yang-Hwa Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/299,250

(22) Filed: Oct. 20, 2016

(65) Prior Publication Data

US 2017/0294165 A1    Oct. 12, 2017

(30) Foreign Application Priority Data

Apr. 8, 2016    (KR) .................. 10-2016-0043498

(51) Int. Cl.
*G09G 3/32*      (2016.01)
*G09G 3/3266*    (2016.01)
(Continued)

(52) U.S. Cl.
CPC .......... *G09G 3/3266* (2013.01); *G09G 3/325* (2013.01); *G09G 3/3233* (2013.01); *G09G 3/3291* (2013.01); *G09G 2300/0819* (2013.01); *G09G 2300/0842* (2013.01); *G09G 2310/08* (2013.01); *G09G 2320/0214* (2013.01)

(58) Field of Classification Search
CPC .... G09G 3/3266; G09G 3/3233; G09G 3/325; G09G 3/3291
See application file for complete search history.

(56) References Cited

U.S. PATENT DOCUMENTS

| 6,426,743 B1* | 7/2002 | Yeo .................. G09G 3/3677 345/100 |
| 2010/0177082 A1* | 7/2010 | Joo .................. G09G 3/3677 345/211 |

(Continued)

FOREIGN PATENT DOCUMENTS

| KR | 10-2013-0137860 A | 12/2013 |
| KR | 10-2014-0025149 A | 3/2014 |

(Continued)

*Primary Examiner* — Kevin M Nguyen
(74) *Attorney, Agent, or Firm* — Lewis Roca Rothgerber Christie LLP

(57) ABSTRACT

A gate driver includes a plurality of stages outputting a plurality of gate output signals, respectively. Each stage includes a first input circuit applying an input signal to a first node in response to a first clock signal, a second input circuit applying the first clock signal to a second node in response to a voltage of the first node, a first output circuit controlling a gate output signal to a first logic level in response to the voltage of the first node, a second output circuit controlling the gate output signal to a second logic level in response to a voltage of the second node, and a leakage current blocking circuit applying a first power voltage corresponding to the first logic level to the first input circuit in response to the voltage of the first node.

20 Claims, 13 Drawing Sheets

(51) Int. Cl.
*G09G 3/3233* (2016.01)
*G09G 3/325* (2016.01)
*G09G 3/3291* (2016.01)

(56) References Cited

U.S. PATENT DOCUMENTS

| | | | | |
|---|---|---|---|---|
| 2011/0199354 A1* | 8/2011 | Iwase | .................... | G09G 3/3677 |
| | | | | 345/208 |
| 2014/0093028 A1* | 4/2014 | Wu | ........................ | G11C 19/28 |
| | | | | 377/64 |
| 2016/0064098 A1* | 3/2016 | Han | ....................... | G11C 19/28 |
| | | | | 345/211 |

FOREIGN PATENT DOCUMENTS

| KR | 10-2014-0076016 A | 6/2014 |
|---|---|---|
| KR | 10-2015-0086973 A | 7/2015 |

\* cited by examiner

GATE DRIVER AND DISPLAY DEVICE HAVING THE SAME

CROSS REFERENCE TO RELATED APPLICATION

This application claims priority to and the benefit of Korean Patent Application No. 10-2016-0043498 filed on Apr. 8, 2016, the content of which is hereby incorporated by reference herein in its entirety.

BACKGROUND

1. Field

Example embodiments of the present disclosure relate to a display device. More particularly, example embodiments of the present disclosure relate to a gate driver and a display device having the gate driver.

2. Description of the Related Art

Generally, a display device includes a display panel and a panel driver. The display panel includes a plurality of gate lines, a plurality of data lines, and a plurality of pixels. The panel driver includes a gate driver providing gate output signals to the gate lines and a data driver providing data signals to the gate lines.

The gate driver includes a plurality of stages outputting gate output signals to the gate lines, respectively. Each stage includes a plurality of transistors and capacitors. When a high power voltage is applied to the gate driver to drive a large-scale display device, the transistors may be deteriorated, thereby changing the threshold voltages of the transistors and generating a leakage current. When the leakage current is generated in the transistors of the stages, voltages of nodes in the stage may not be able to be stably maintained. Accordingly, the gate output signal has a ripple or the gate output signal can not be normally outputted.

SUMMARY

Aspects of example embodiments are directed toward a gate driver capable of stably outputting a gate output signal.

Aspects of example embodiments are directed toward a display device having the gate driver.

According to some example embodiments, a gate driver may include a plurality of stages outputting a plurality of gate output signals, respectively. Each stage may include a first input circuit configured to receive a previous gate output signal from one of previous stages or a vertical start signal as an input signal and to apply the input signal to a first node in response to a first clock signal, a second input circuit configured to apply the first clock signal to a second node in response to a voltage of the first node, a first output circuit configured to control a gate output signal to a first logic level in response to the voltage of the first node, a second output circuit configured to control the gate output signal to a second logic level in response to a voltage of the second node, and a leakage current blocking circuit configured to apply a first power voltage corresponding to the first logic level to the first input circuit in response to the voltage of the first node.

In example embodiments, the first input circuit may include a first input transistor including a gate electrode receiving the first clock signal, a first electrode receiving the input signal, and a second electrode connected to a third node, and a second input transistor including a gate electrode receiving the first clock signal, a first electrode connected to the third node, and a second electrode connected to the first node.

In example embodiments, the leakage current blocking circuit may include a first blocking transistor including a gate electrode connected to the first node, a first electrode receiving the first power voltage, and a second electrode connected to the third node.

In example embodiments, each stage may further include a stabilizing circuit configured to stabilize the gate output signal in response to the voltage of the second node and the second clock signal. The stabilizing circuit may include a first stabilizing transistor including a gate electrode connected to the second node, a first electrode receiving a second power voltage, and a second electrode connected to a fourth node, a second stabilizing transistor including a gate electrode connected to the second node, a first electrode connected to the fourth node, and a second electrode, and a third stabilizing transistor including a gate electrode receiving the second clock signal, a first electrode connected to the second electrode of the second stabilizing transistor, and a second electrode connected to the first node.

In example embodiments, the leakage current blocking circuit may include a first blocking transistor including a gate electrode connected to the first node, a first electrode receiving the first power voltage, and a second electrode connected to the fourth node.

In example embodiments, the first output circuit may include a first output transistor including a gate electrode receiving the voltage of the first node, a first electrode receiving the second clock signal, and a second electrode connected to an output terminal to which the gate output signal is outputted. The second output circuit may include a second output transistor including a gate electrode connected to the second node, a first electrode receiving a third power voltage, and a second electrode connected to the output terminal.

In example embodiments, the third power voltage may be higher than the second power voltage.

In example embodiments, a first width-to-length ratio of the first output transistor may be smaller than a second width-to-length ratio of the second output transistor.

In example embodiments, the second output circuit may include a third output transistor including a gate electrode connected to the second node, a first electrode receiving the second power voltage, and a second electrode connected to a fifth node, and a fourth output transistor including a gate electrode connected to the second node, a first electrode connected to the fifth node, and a second electrode connected to an output terminal to which the gate output signal is outputted.

In example embodiments, the leakage current blocking circuit may include a first blocking transistor including a gate electrode connected to the first node, a first electrode receiving the first power voltage, and a second electrode connected to the fifth node.

In example embodiments, each stage further may include a holding circuit configured to maintain a voltage of the second node as the first logic level in response to the first clock signal.

In example embodiments, each stage may further include a load reducing circuit connected between the first input circuit and the first output circuit and configured to lower the voltage of the first node.

According to some example embodiments, a gate driver may include a plurality of stages outputting a plurality of gate output signals and a plurality of carry signals, respectively. Each stage may include a first input circuit configured to receive a previous carry signal from one of previous stages or a vertical start signal as an input signal and to apply the input signal to a first node in response to a first clock signal, a second input circuit configured to apply the first clock signal to a second node in response to a voltage of the first node, a first output circuit configured to control a gate output signal to a first logic level in response to the voltage of the first node, a second output circuit configured to control the gate output signal to a second logic level in response to a voltage of the second node, a first carry output circuit configured to control a carry signal to the first logic level in response to the voltage of the first node, a second carry output circuit configured to control the carry signal to the second logic level in response to the voltage of the second node, and a leakage current blocking circuit configured to apply the carry signal to the first input circuit in response to the carry signal.

In example embodiments, the first input circuit may include a first input transistor including a gate electrode receiving the first clock signal, a first electrode receiving the input signal, and a second electrode connected to a third node, and a second input transistor including a gate electrode receiving the first clock signal, a first electrode connected to the third node, and a second electrode connected to the first node.

In example embodiments, the leakage current blocking circuit may include a second blocking transistor including a gate electrode receiving the carry signal, a first electrode receiving the carry signal, and a second electrode connected to the third node.

In example embodiments, each stage may further include a stabilizing circuit configured to stabilize the gate output signal in response to the voltage of the second node and the second clock signal. The stabilizing circuit may include a first stabilizing transistor including a gate electrode connected to the second node, a first electrode receiving a second power voltage, and a second electrode connected to a fourth node, a second stabilizing transistor including a gate electrode connected to the second node, a first electrode connected to the fourth node, and a second electrode, and a third stabilizing transistor including a gate electrode receiving the second clock signal, a first electrode connected to the second electrode of the second stabilizing transistor, and a second electrode connected to the first node.

In example embodiments, the leakage current blocking circuit may include a second blocking transistor including a gate electrode receiving the carry signal, a first electrode receiving the carry signal, and a second electrode connected to the fourth node.

In example embodiments, the first output circuit may include a first output transistor including a gate electrode receiving the voltage of the first node, a first electrode receiving the second clock signal, and a second electrode connected to an output terminal to which the gate output signal is outputted. The second output circuit may include a second output transistor including a gate electrode connected to the second node, a first electrode receiving a third power voltage, and a second electrode connected to the output terminal. The first carry output circuit may include a first carry output transistor including a gate electrode receiving the voltage of the first node, a first electrode receiving a second clock signal, and a second electrode connected to a carry output terminal to which the carry signal is outputted. The second carry output circuit may include a second carry output transistor including a gate electrode connected to the second node, a first electrode receiving the second power voltage, and a second electrode connected to the carry output terminal.

In example embodiments, the third power voltage may be higher than the second power voltage.

According to some example embodiments, a display device may include a display panel including a plurality of gate lines, a plurality of data lines, and a plurality of pixels, a data driver configured to provide data signals to the pixels via the data lines, and a gate driver including a plurality of stages outputting a plurality of gate output signals, respectively, and configured to provide the gate output signals to the pixels via the gate lines. Each stage of the gate driver may include a first input circuit configured to receive a previous gate output signal from one of previous stages or a vertical start signal as an input signal and to apply the input signal to a first node in response to a first clock signal, a second input circuit configured to apply the first clock signal to a second node in response to a voltage of the first node, a first output circuit configured to control a gate output signal to a first logic level in response to the voltage of the first node, a second output circuit configured to control the gate output signal to a second logic level in response to a voltage of the second node, a stabilizing circuit configured to stabilize the gate output signal in response to the voltage of the second node and the second clock signal, and a leakage current blocking circuit configured to apply a first power voltage corresponding to the first logic level to at least one of the first input circuit and the stabilizing circuit in response to the voltage of the first node.

Therefore, in a gate driver according to example embodiments, two transistors connected to each other in series are located in a part of each stage in which the leakage current occurs. A high level voltage is applied the node between the two transistors, thereby preventing or reducing the leakage current. Accordingly, the gate driver can stably maintain voltages of nodes in each stage, reduce ripple of the gate output signal, and prevent abnormal pulse of the gate output signal.

In addition, a large-scale display device can be stably driven by including the gate driver of which reliability is improved.

BRIEF DESCRIPTION OF THE DRAWINGS

Exemplary embodiments will be described more fully hereinafter with reference to the accompanying drawings, in which various embodiments are shown.

DETAILED DESCRIPTION

Exemplary embodiments will be described more fully hereinafter with reference to the accompanying drawings, in which various embodiments are shown.

Figure 1:
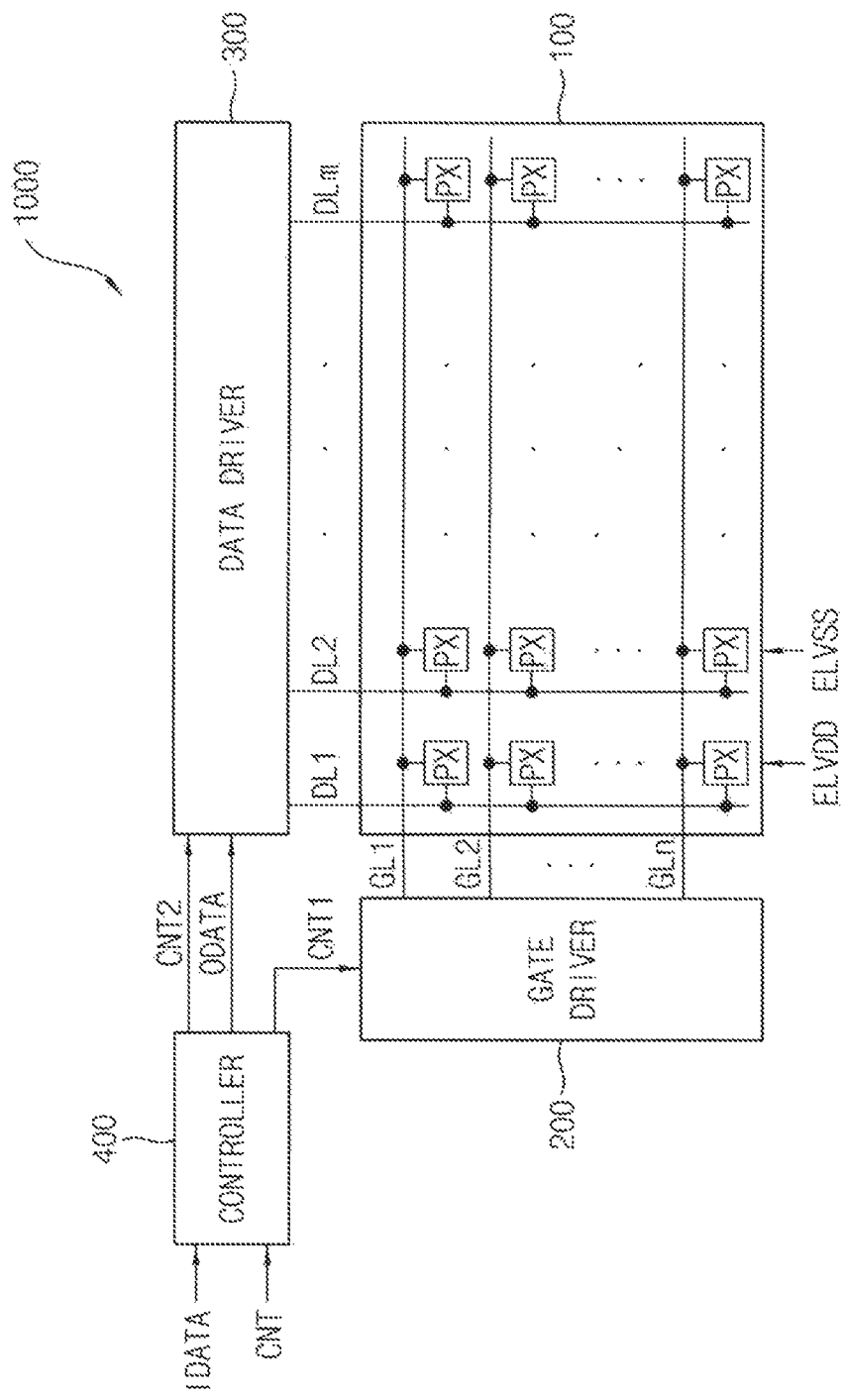
FIG. 1 is a block diagram illustrating a display device according to example embodiments.

FIG. 1 is a block diagram illustrating a display device according to one example embodiment.

Referring to FIG. 1, the display device 1000 may include a display panel 100, a gate driver 200, a data driver 300, and a controller 400.

The display panel 100 may display an image. The display panel 100 may include a plurality of gate lines GL1 through GLn, a plurality of data lines DL1 through DLm, and a plurality of pixels PX. For example, the display panel 100 may include n*m pixels PX because the pixels PX are arranged at locations corresponding to crossing points of the gate lines GL1 through GLn and the data lines DL1 through DLm.

The gate driver 200 may provide gate output signals to the pixels PX via the gate lines GL1 through GLn. The gate driver 200 may include a plurality of stages outputting the gate output signals, respectively. Each stage of the gate driver 200 may include a first input circuit, a second input circuit, a first output circuit, a second output circuit, a stabilizing circuit, and a leakage current blocking circuit. Each stage of the gate driver 200 can prevent or reduce the leakage current by including the leakage current blocking circuit. For example, in order to reduce the leakage current, two transistors connected to each other in series are located in a part of each stage in which the leakage current occurs, and then a high level voltage is applied between the two transistors.

Therefore, the gate driver 200 can stably maintain voltages of nodes of the stage and prevent ripples of the gate output signal by reducing the leakage current. Hereinafter, a structure of stage of the gate driver 200 will be described in more detail with reference to the FIGS. 4, 6, 8, and 11.

The data driver 300 may receive a second control signal CNT2 and output image data ODATA. The data driver 300 may convert the output image data ODATA into analog type data signals and provide the data signals to the pixels PX via the data lines DL1 through DLm based on the second control signal CNT2.

The controller 400 may control the gate driver 200 and the data driver 300. The controller 400 may receive input image data DATA and control signals CNT from outside of the display device 1000 (e.g., a system board). The controller 400 may generate the first and second control signals CNT1 and CNT2 to control the gate driver 200 and the data driver 300. For example, the first control signal CNT1 for the controlling the gate driver 200 may include a vertical start signal, gate clock signals, etc. The second control signal CNT2 for the controlling the data driver 300 may include a horizontal start signal, a load signal, etc. The controller 400 may generate output image data ODATA suitable to the operating conditions of the display panel 100 based on the input image data DATA and provide the output image data ODATA to the data driver 300.

Figure 2:
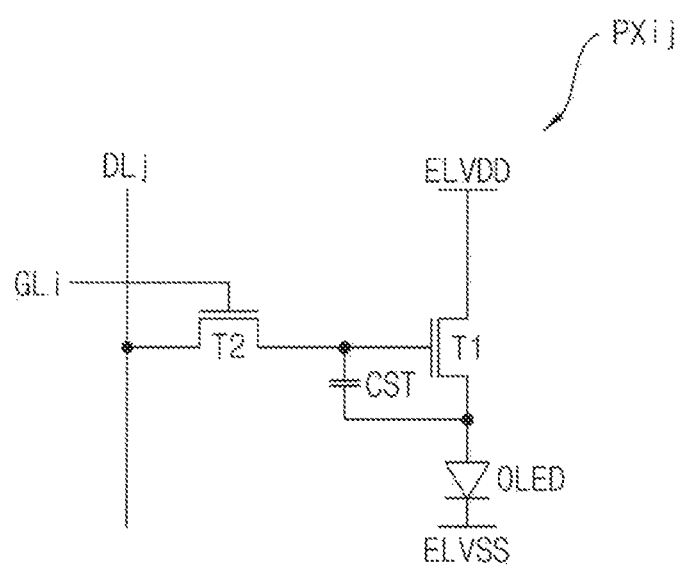
FIG. 2 is a circuit diagram illustrating an example of a pixel included in a display device of FIG. 1.

FIG. 2 is a circuit diagram illustrating an example of a pixel included in a display device of FIG. 1.

Referring to FIG. 2, the pixel PXij may include an organic light emitting diode OLED, a driving transistor T1, a capacitor CST, and a switching transistor T2.

The driving transistor T1 may include a gate electrode connected to a second electrode of the switching transistor T2, a first electrode connected to a first emission voltage ELVDD, and a second electrode connected to a first electrode of the OLED.

The switch transistor T2 may include a gate electrode connected to a gate line GLi, a first electrode connected to a data line DLj, and a second electrode connected to the gate electrode of the driving transistor T1. The switching transistor T2 may provide a data signal received from the data line DLj to the gate electrode of the driving transistor T1 in response to a gate output signal received from the gate line GLi.

The capacitor CST may include a first electrode connected to the gate electrode of the driving transistor T1 and a second electrode connected to the second electrode of the driving transistor T1. The capacitor CST may charge the data signal applied to the gate electrode of the driving transistor T1 and may maintain the charged voltage of the gate electrode of the driving transistor T1 after the switch transistor T2 is turned-off.

The OLED may include the first electrode connected to the second electrode of the driving transistor T1 and the second electrode receiving the second emission voltage ELVSS (or connected to a source of the second emission voltage ELVSS). The OLED may emit the light based on the driving current provided from the driving transistor T1.

Although, the example embodiment of FIG. 2 describes that the pixel PXij includes two transistors and one capacitor, the pixel may be implemented in a variety of suitable structures.

Figure 3:
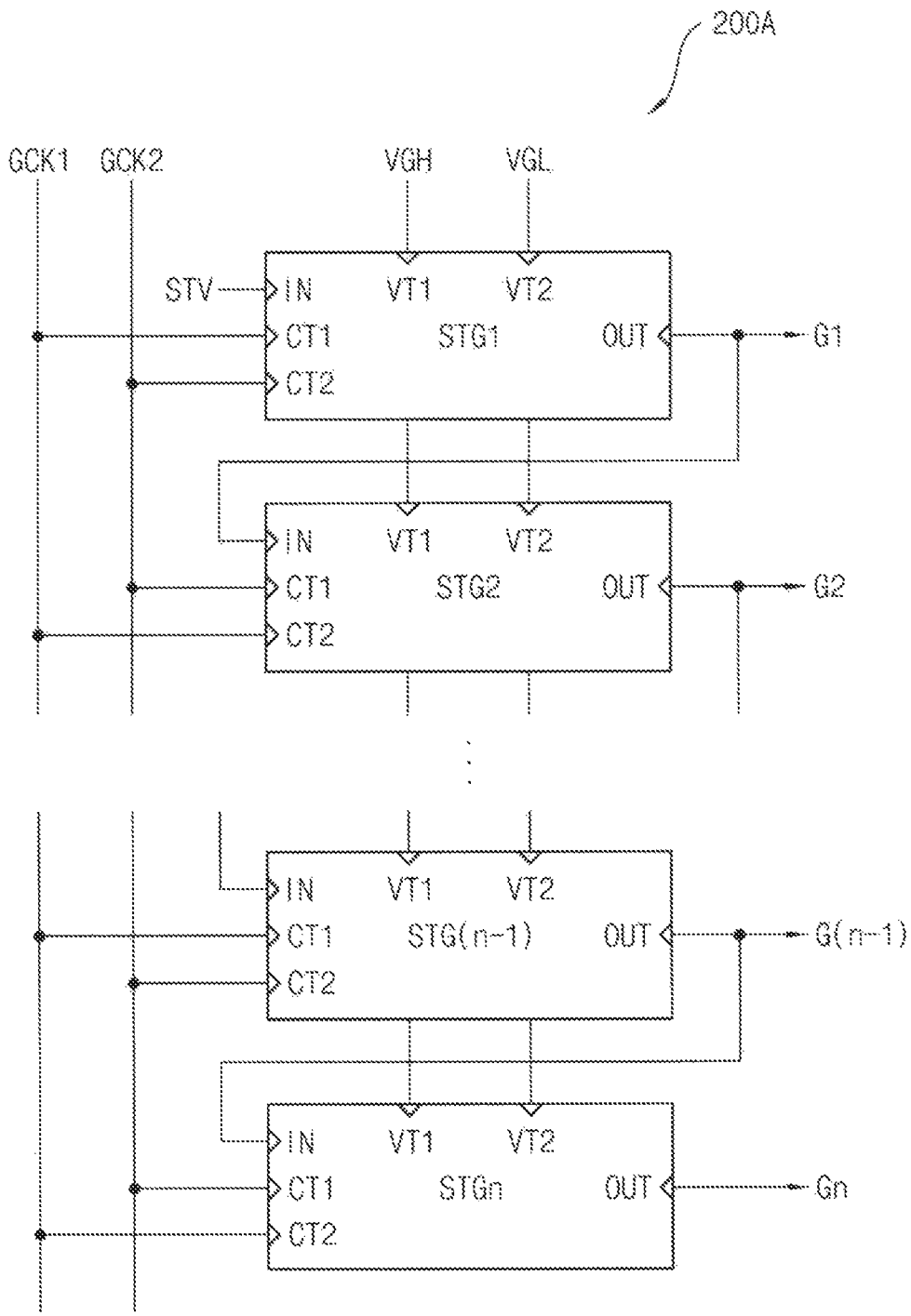
FIG. 3 is a block diagram illustrating one example of a gate driver included in a display device of FIG. 1.

FIG. 3 is a block diagram illustrating one example of a gate driver included in a display device of FIG. 1.

Referring to FIG. 3, the gate driver 200A may include a plurality of stages STG1 through STGn. Each of the stages STG1 through STGn may include an input terminal IN, a first clock terminal CT1, a second clock terminal CT2, a first voltage terminal VT1, a second voltage terminal VT2, and an output terminal OUT.

A first gate clock signal GCK1 and a second gate clock signal GCK2 having different timings may be applied to the first clock terminal CT1 and the second clock terminal CT2. For example, the second gate clock signal GCK2 may be a signal inverted from the first gate clock signal GCK1. In adjacent stages, the first gate clock signal GCK1 and the second gate clock signal GCK2 may be applied in opposite sequences. For example, in the odd-numbered stages (e.g., STG1, STG3, etc), the first gate clock signal GCK1 may be applied to the first clock terminal CT1 as the first clock signal, and the second gate clock signal GCK2 may be applied to the second clock terminal CT2 as the second clock signal. In contrast, in the even-numbered stages (e.g., STG2, STG4, etc), the second gate clock signal GCK2 may be applied to the first clock terminal CT1 as the first clock signal, and the first gate clock signal GCK1 may be applied to the second clock terminal CT2 as the second clock signal.

An input signal may be applied to the input terminal IN. The input signal may be a vertical start signal STV or a previous gate output signal outputted from one of the previous stages. For example, the vertical start signal SW is applied to the input terminal IN of the first stage STG1. The previous gate output signal of the preceding gate may be respectively applied to each input terminal IN of the others stages STG2 through STGn. The gate output signals G1 through Gn may be outputted to the gate lines via the output terminals OUT of the stages STG1 through STGn, respectively.

A first power voltage VGH corresponding to a first logic level may be provided to the first voltage terminals VT1 of the stages STG1 through STGn. For example, the first power voltage VGH may correspond to high level voltage. A second power voltage VGL corresponding to a second logic level may be provided to the second voltage terminals VT2 of the stages STG1 through STGn. For example, the second power voltage VGL may correspond to low level voltage.

Figure 4:
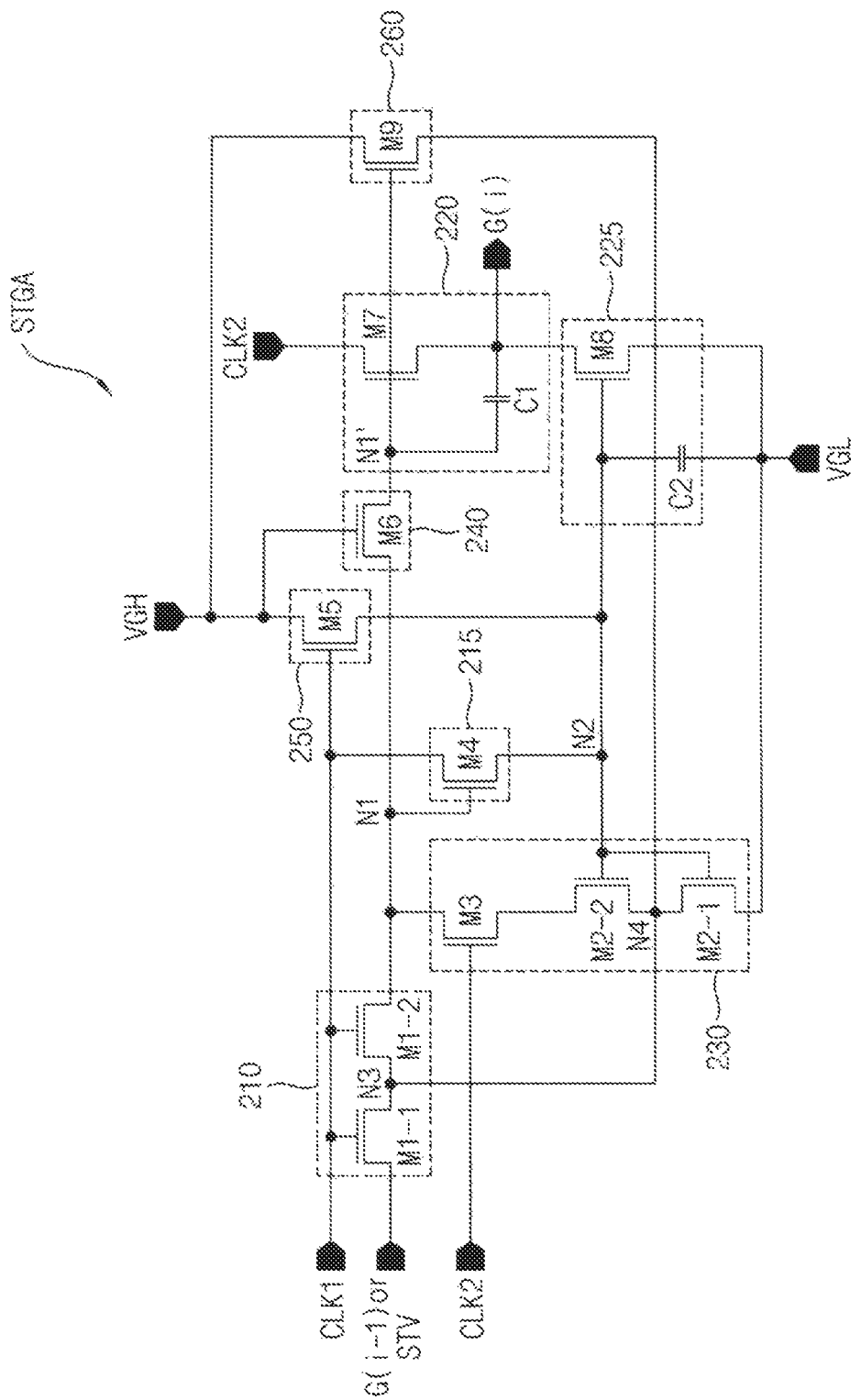
FIG. 4 is a circuit diagram illustrating one example of a stage included in a gate driver of FIG. 3.

FIG. 4 is a circuit diagram illustrating one example of a stage included in a gate driver of FIG. 3.

Referring to FIG. 4, a stage STGA of the gate driver may include a first input circuit 210, a second input circuit 215, a first output circuit 220, a second output circuit 225, a stabilizing circuit 230, a load reducing circuit 240, a holding circuit 250, and a leakage current blocking circuit 260.

The first input circuit 210 may receive a previous gate output signal G(i-1) from one of previous stages or a vertical start signal STV as an input signal and apply the input signal to a first node N1 in response to a first clock signal CLK1. For example, the first clock signal CLK1 applied to the first clock terminal corresponds to the first gate clock signal in odd-numbered stages and corresponds to the second gate clock signal in even-numbered stages.

The first input circuit 210 may include a plurality of transistors that are connected to each other in series. Therefore, the first input circuit 210 may reduce the leakage current flowing from the first node N1 to the input terminal when the voltage of the first node N1 corresponds to high level voltage. In one example embodiment, the first input circuit 210 may include a first input transistor M1-1 and a second input transistor M1-2. The first input transistor M1-1 may include a gate electrode receiving the first clock signal CLK1, a first electrode receiving the input signal, and a second electrode connected to a third node N3. The second input transistor M1-2 may include a gate electrode receiving the first clock signal CLK1, a first electrode connected to the third node N3, and a second electrode connected to the first node N1.

The second input circuit 215 may apply the first clock signal CLK1 to a second node N2 in response to a voltage of the first node N1. In one example embodiment, the second input circuit 215 may include a third input transistor M4 including a gate electrode connected to the first node N1, a first electrode receiving the first clock signal CLK1, and a second electrode connected to the second node N2.

The first output circuit 220 may control a gate output signal G(i) to a first logic level (e.g., high level) in response to the voltage of the first node N1. In one example embodiment, the first output circuit 220 may include a first output transistor M7 and a first capacitor C1. The first output transistor M7 may include a gate electrode connected to a node N1', a first electrode receiving the second clock signal CLK2, and a second electrode connected to an output terminal to which the gate output signal G(i) is outputted. The first capacitor C1 may include a first electrode connected to the node N1' and a second electrode connected to the output terminal. Here, the second clock signal CLK2 applied to the second clock terminal corresponds to the second gate clock signal in odd-numbered stages and corresponds to the first gate clock signal in even-numbered stages.

The second output circuit 225 may control the gate output signal G(i) to a second logic level (e.g., low level) in response to a voltage of the second node N2. In one example embodiment, the second output circuit 225 may include a second output transistor M8 and a second capacitor C2. The second output transistor M8 may include a gate electrode connected to the second node N2, a first electrode receiving a second power voltage VGL, and a second electrode connected to the output terminal. The second capacitor C2 may include a first electrode connected to the second node N2 and a second electrode receiving the second power voltage VGL.

The stabilizing circuit 230 may stabilize the gate output signal G(i) in response to the voltage of the second node N2 and the second clock signal CLK2. The stabilizing circuit 230 may include a plurality of transistors connected to each other in series so as to reduce the leakage current flowing from the first node N1 to the second voltage terminal when the voltage of the first node N1 corresponds to high level voltage. In one example embodiment, the stabilizing circuit 230 may include a first stabilizing transistor M2-1, a second stabilizing transistor M2-2, and a third stabilizing transistor M3. The first stabilizing transistor M2-1 may include a gate electrode connected to the second node N2, a first electrode receiving a second power voltage VGL, and a second electrode connected to a fourth node N4. The second stabilizing transistor M2-2 may include a gate electrode connected to the second node N2, a first electrode connected to the fourth node N4, and a second electrode connected to the first electrode of the third stabilizing transistor M3. The third stabilizing transistor M3 may include a gate electrode receiving the second clock signal CLK2, a first electrode connected to the second electrode of the second stabilizing transistor M2-2, and a second electrode connected to the first node N1.

The load reducing circuit 240 may be connected between the first input circuit 210 and the first output circuit 220 and lower the voltage of the first node N1. In one example embodiment, the load reducing circuit 240 may include a reducing transistor M6. The reducing transistor M6 may include a gate electrode receiving the first power voltage (VGH), a first electrode connected to the second electrode of the second input transistor M1-2 (i.e., connected to the node N1), and a second electrode connected to the gate electrode of the first output transistor M7 (i.e., connected to the node N1'). Thus, the reducing transistor M6 can lower the voltage of the first node N1 in order to reduce the load of the first through third input transistors M1-1, M1-2, and M4 and the third stabilizing transistor M3 that are connected to the first node N1. For example, when the voltage of the node N1' increases beyond the voltage of the first power voltage VGH, the reducing transistor M6 can prevent the voltage of the node N1 from increasing with the voltage of the node N1'.

The holding circuit 250 may maintain a voltage of the second node N2 as the first logic level in response to the first clock signal CLK1. In one example embodiment, the holding circuit 250 may include a holding transistor M5. The holding transistor M5 may include a gate electrode receiving the first clock signal CLK1, a first electrode receiving the first power voltage VGH, and a second electrode connected to the second node N2.

The leakage current blocking circuit 260 may apply the first power voltage VGH corresponding to the first logic level to at least one of the first input circuit 210 and the stabilizing circuit 230 in response to the voltage of the first node N1. In one example embodiment, the leakage current blocking circuit 260 may include a first blocking transistor M9. The first blocking transistor M9 may include a gate electrode connected to the first node N1 (via, for example, N1'), a first electrode receiving the first power voltage VGH, and a second electrode connected to the third node N3 and the fourth node N4. The leakage current blocking circuit 260 may control a voltage of the third node N3 to high level voltage so as to reduce the leakage current flowing from the first node N1 to the input terminal when the voltage of the first node N1 corresponds to high level voltage. Also, the leakage current blocking circuit 260 may control a voltage of the fourth node N4 to high level voltage so as to reduce the leakage current flowing from the first node N1 to the second voltage terminal when the voltage of the first node N1 corresponds to high level voltage.

Although, the example embodiment of FIG. 4 describes that the stage includes the load reducing circuit, in some alternative embodiments the stage does not include the load reducing circuit and the first input circuit is directly connected to the first output circuit.

Figure 5:
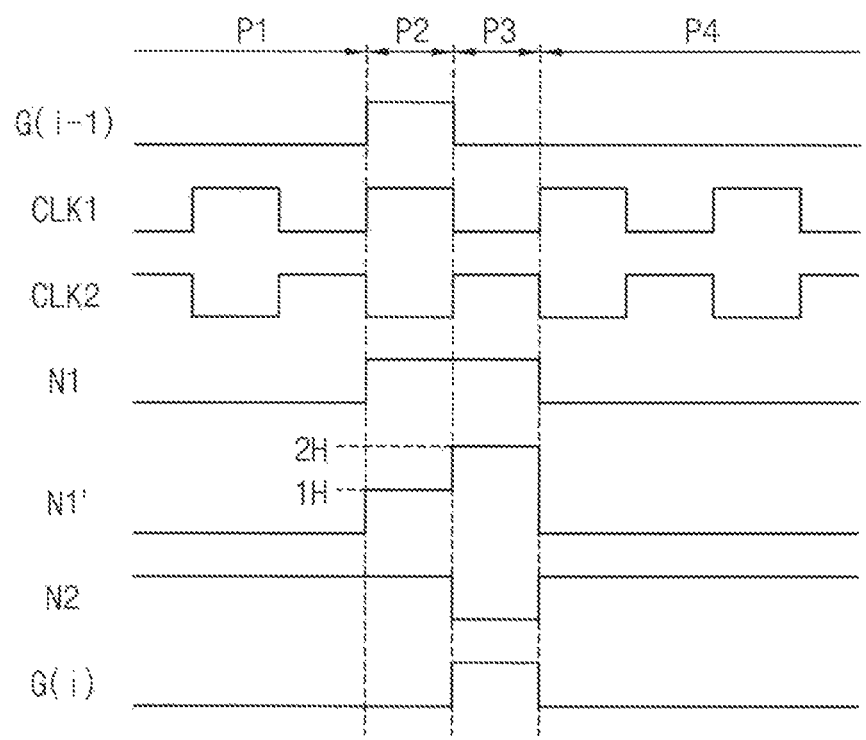
FIG. 5 is a timing diagram for describing an operation of a stage of FIG. 4.

FIG. 5 is a timing diagram for describing an operation of a stage of FIG. 4.

Referring to FIG. 5, stages of the gate driver may sequentially output gate output signals to gate lines. Each stage includes a load reducing circuit for lowering a voltage of a first node N1.

During the first period P1, a previous gate output signal G(i-1) outputted from the previous stage may be a low level. The first input circuit 210 may apply the previous gate output signal G(i-1) with low level to the first node N1 in response to the first clock signal CLK1. Accordingly, the voltage of the first node N1 may be low level. Also, the holding circuit 250 may apply the first power voltage to the second node N2 in response to the first clock signal CLK1. Accordingly, the voltage of the second node N2 may be high level. Because the voltage of the second node N2 may be at a high level, the second output circuit 225 may maintain the gate output signal G(i) as a low level.

During the second period P2, a previous gate output signal G(i-1) may have transitioned from low level to high level. The first input circuit 120 may apply the previous gate output signal G(i-1) with high level to the first node N1 in response to the clock signal CLK1. Accordingly, the voltage of the nodes N1 and N1' may be high level. Here, in order to reduce load of transistors connected to the first node N1, the reducing transistor M6 of the load reducing circuit 240 may be located between the first input circuit 210 and the first output circuit 220 (i.e., between the nodes N1 and N1'). In addition, the holding circuit 250 may apply the first power voltage to the second node N2 in response to the first clock signal CLK1. Accordingly, the voltage of the second node N2 may be high level.

During the third period P3, when the second clock signal CLK2 corresponds to high level, the voltage of the node N1' may be boot-strapped due to the coupling of the first capacitor C1 and may correspond to the second high level 2H at about two times greater than the first high level 1H. Therefore, the gate output signal G(i) having high level may be outputted via the output terminal. Thus, the voltage of the node N1' may correspond to the second high level 2H. However, because the gate electrode of the reducing transistor M6 receives a voltage having the first high level 1H and the second electrode of the reducing transistor M6 receives a voltage having the boosted second high level 2H, a voltage level of the first node N1 may not increase and correspond to the first high level 1H.

During the third period P4, the voltage of the first node N1 is maintained as low level and the voltage of the second node N2 is maintained as high level. Therefore, the gate output signal G(i) is maintained as low level.

Figure 6:
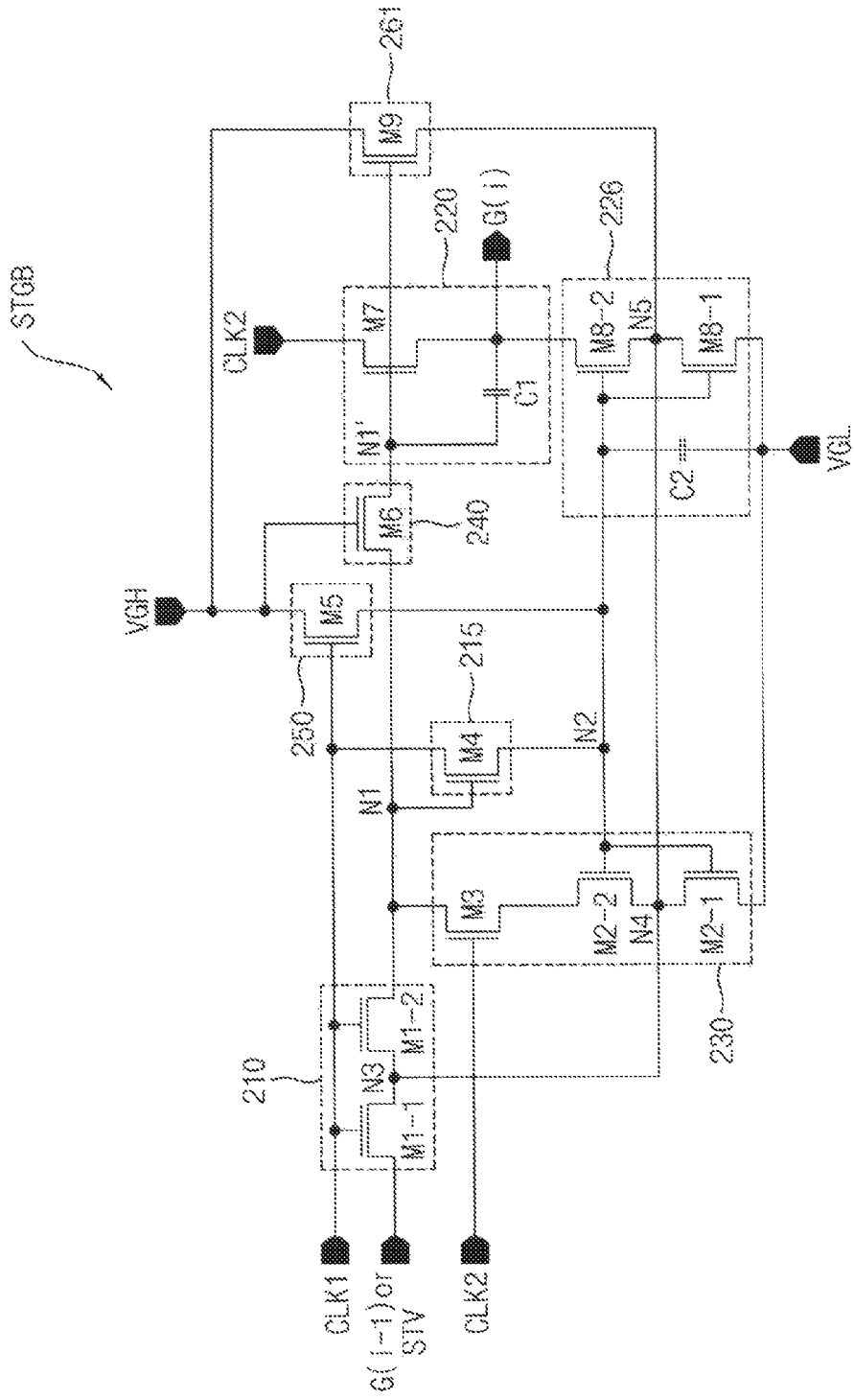
FIG. 6 is a circuit diagram illustrating another example of a stage included in a gate driver of FIG. 3.

FIG. 6 is a circuit diagram illustrating another example of a stage included in a gate driver of FIG. 3.

Referring to FIG. 6, a stage STGB of the gate driver may include a first input circuit 210, a second input circuit 215, a first output circuit 220, a second output circuit 226, a stabilizing circuit 230, a load reducing circuit 240, a holding circuit 250, and a leakage current blocking circuit 261. The stage STGB according to the present exemplary embodiment is substantially the same as the stage of the exemplary embodiment described in FIG. 4, except that the second output circuit 226 includes two transistor that are connected to each other in series. Therefore, the same reference numerals will be used to refer to the same or like parts as those described in the previous exemplary embodiment of FIG. 4 and any repetitive explanation concerning the above elements will be omitted.

The second output circuit 226 may control the gate output signal G(i) to a second logic level in response to a voltage of the second node N2. In one example embodiment, the second output circuit 226 may include a third output transistor M8-1, a fourth output transistor M8-2, and a second capacitor C2. The third output transistor M8-1 may include a gate electrode connected to the second node N2, a first electrode receiving the second power voltage VGL, and a second electrode connected to a fifth node N5. The fourth output transistor M8-2 may include a gate electrode connected to the second node N2, a first electrode connected to the fifth node N5, and a second electrode connected to an output terminal to which the gate output signal G(i) is outputted. The second capacitor C2 may include a first electrode connected to the second node N2 and a second electrode receiving the second power voltage VGL (or connected to a source of the second power voltage VGL).

The leakage current blocking circuit 261 may apply the first power voltage (VGH) corresponding to the first logic level to the first input circuit 210, the stabilizing circuit 230, and the second output circuit 226 in response to the voltage of the first node N1. In one example embodiment, the leakage current blocking circuit 261 may include a first blocking transistor M9. The first blocking transistor M9 may include a gate electrode connected to the first node N1, a first electrode receiving the first power voltage VGH, and a second electrode connected to the third through fifth nodes N3 through N5. The leakage current blocking circuit 261 may control a voltage of the third node N3 to high level voltage so as to reduce the leakage current flowing from the first node N1 to the input terminal when the voltage of the first node N1 corresponds to high level voltage. The leakage current blocking circuit 261 may control a voltage of the fourth node N4 to high level voltage so as to reduce the leakage current flowing from the first node N1 to the second voltage terminal when the voltage of the first node N1 corresponds to high level voltage. Also, the leakage current blocking circuit 261 may control a voltage of the fifth node N5 to high level voltage so as to reduce the leakage current flowing from the first node N1 to the second voltage terminal when the voltage of the first node N1 corresponds to high level voltage.

Figure 7:
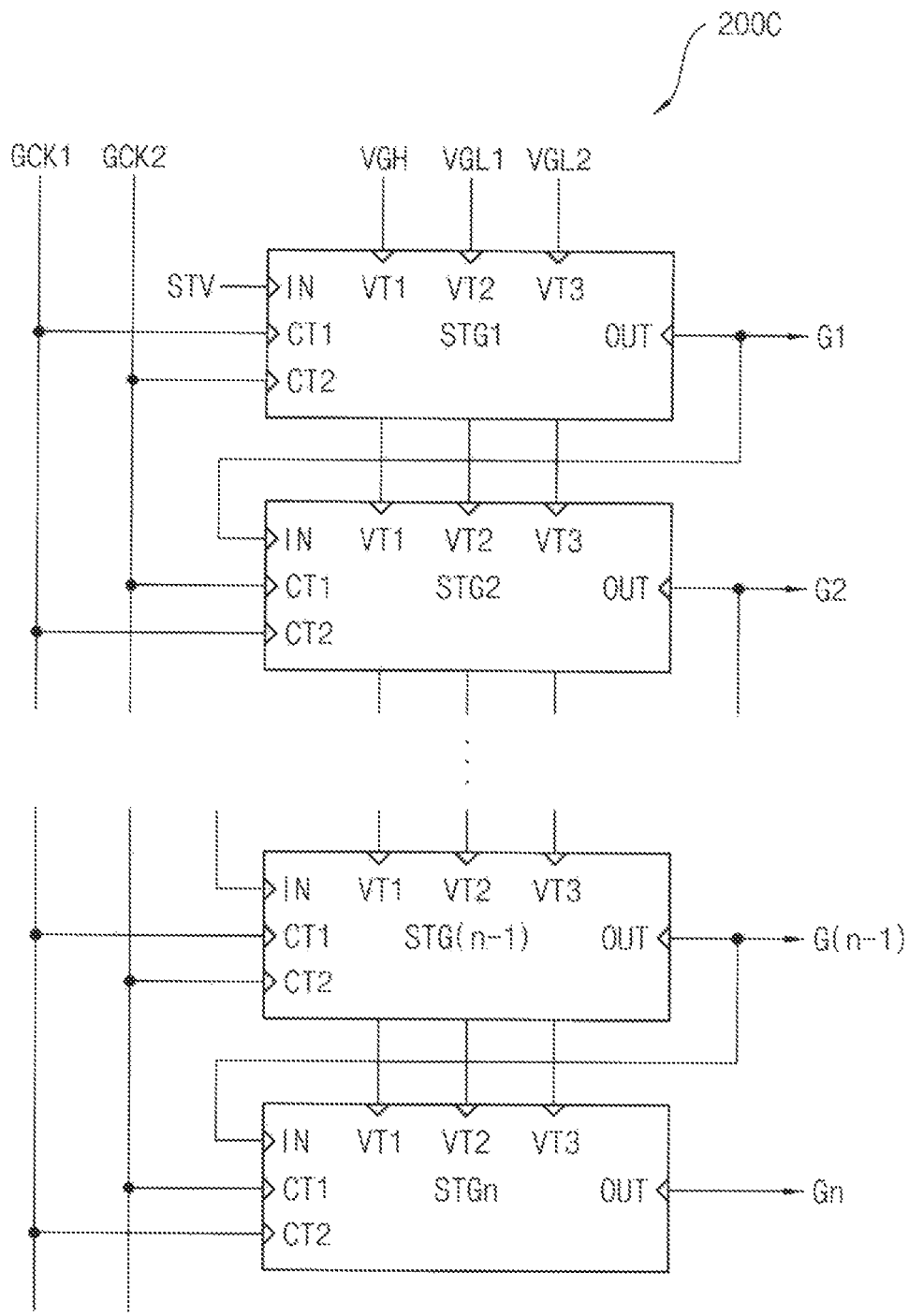
FIG. 7 is a block diagram illustrating another example of a gate driver included in a display device of FIG. 1.

FIG. 7 is a block diagram illustrating another example of a gate driver included in a display device of FIG. 1.

Referring to FIG. 7, the gate driver 200C may include a plurality of stages STG1 through STGn. Each of the stages STG1 through STGn may include an input terminal IN, a first clock terminal CT1, a second clock terminal CT2, a first voltage terminal VT1, a second voltage terminal VT2, a third voltage terminal VT3, and a output terminal OUT. The gate driver 200C according to the present exemplary embodiment may include similar parts or elements to those of the gate driver of the exemplary embodiment described in FIG. 3. Therefore, the same reference numerals will be used to refer to the same or like parts as those described in the previous exemplary embodiment of FIG. 3 and any repetitive explanation concerning the above elements will be omitted.

A first power voltage VGH corresponding to a first logic level may be provided to the first voltage terminals VT1 of the stages STG1 through STGn. For example, the first power voltage VGH may correspond to high level. A second power voltage VGL1 corresponding to a second logic level may be provided to the second voltage terminals VT2 of the stages STG1 through STGn. For example, the second power voltage VGL1 may correspond to the first low level. A third power voltage VGL2 corresponding to the second logic level may be provided to the third voltage terminals VT3 of the stages STG1 through STGn. For example, the third power voltage VGL2 may correspond to the second low level higher than the first low level.

Figure 8:
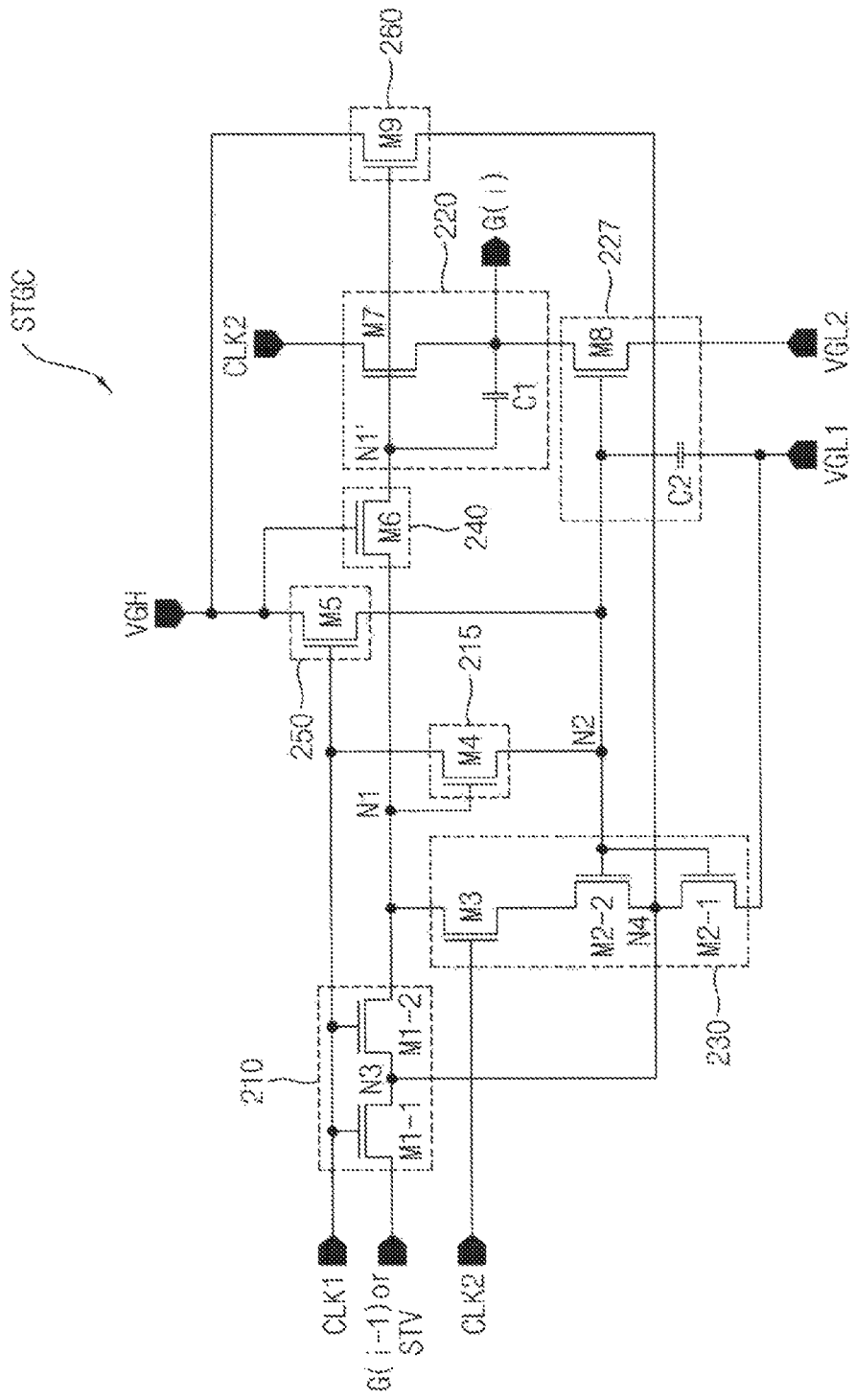
FIG. 8 is a circuit diagram illustrating one example of a stage included in a gate driver of FIG. 7.

FIG. 8 is a circuit diagram illustrating one example of a stage included in a gate driver of FIG. 7.

Referring to FIG. 8, a stage STGC of the gate driver may include a first input circuit 210, a second input circuit 215, a first output circuit 220, a second output circuit 227, a stabilizing circuit 230, a load reducing circuit 240, a holding circuit 250, and a leakage current blocking circuit 260. The first input circuit 210, the second input circuit 215, the stabilizing circuit 230, the load reducing circuit 240, the holding circuit 250, and the leakage current blocking circuit 260 according to the present exemplary embodiment are substantially the same as the first input circuit, the second input circuit, the stabilizing circuit, the load reducing circuit, the holding circuit, and the leakage current blocking circuit of the exemplary embodiment described in FIG. 4, respectively, duplicated descriptions will be omitted.

The first output circuit 220 may control a gate output signal G(i) to a first logic level in response to the voltage of the first node N1. In one example embodiment, the first output circuit 220 may include a first output transistor M7 and a first capacitor C1. The first output transistor M7 may include a gate electrode connected to a node N1', a first electrode receiving the second clock signal CLK2, and a second electrode connected to an output terminal to which the gate output signal G(i) is outputted. The first capacitor C1 may include a first electrode connected to the node N1' and a second electrode connected to the output terminal.

The second output circuit 227 may control the gate output signal G(i) to a second logic level in response to a voltage of the second node N2. In one example embodiment, the second output circuit 227 may include a second output transistor M8 and a second capacitor C2. The second output transistor M8 may include a gate electrode connected to the second node N2, a first electrode receiving the third power voltage VGL2, and a second electrode connected to the output terminal. The second capacitor C2 may include a first electrode connected to the second node N2 and a second electrode receiving the second power voltage VGL1.

The stage STGC may receive the second and third power voltages VGL1 and VGL2 that correspond to the second logic level to prevent the leakage current. In one example embodiment, the third power voltage VGL2 may be higher than the second power voltage VGL1. The stabilizing circuit 230 may set the voltage of the first node N1 to the second power voltage VGL1. In contrast, the second output circuit 227 may set the gate output signal G(i) to the third power voltage VGL2. Accordingly, when the first low level voltage (i.e., the second power voltage VGL1) is applied to the gate electrode of the first output transistor M7, the second low level voltage (i.e., the third power voltage VGL2) higher than the first low level voltage is applied to the second electrode of the first output transistor M7. Therefore, the leakage current flowing from the first electrode to the second electrode of the first output transistor M7 can be reduced. In addition, when the first low level voltage is applied to the gate electrode of the second output transistor M8, the second low level voltage greater than the first low level voltage is applied to the first electrode of the second output transistor M8. Therefore, the leakage current flowing from the second electrode to the first electrode of the second output transistor M8 can be reduced.

In one example embodiment, a first width-to-length ratio of the first output transistor M7 may be smaller than a second width-to-length ratio of the second output transistor M8. Thus, the second power voltage VGL1 may be applied to the stabilizing circuit 230 and the third power voltage VGL2 may be applied to the second output circuit 227 to prevent or reduce the leakage current flowing through the first output transistor M7. Accordingly, the first output transistor M7 can be implemented in small size. For example, the first width-to-length ratio of the first output transistor M7 may be equal to or less than 30% of the second width-to-length ratio of the second output transistor M8. For example, a width of the first output transistor M7 may be about 120 micrometer and a width of the second output transistor M8 may be about 450 micrometer.

Figure 9A:
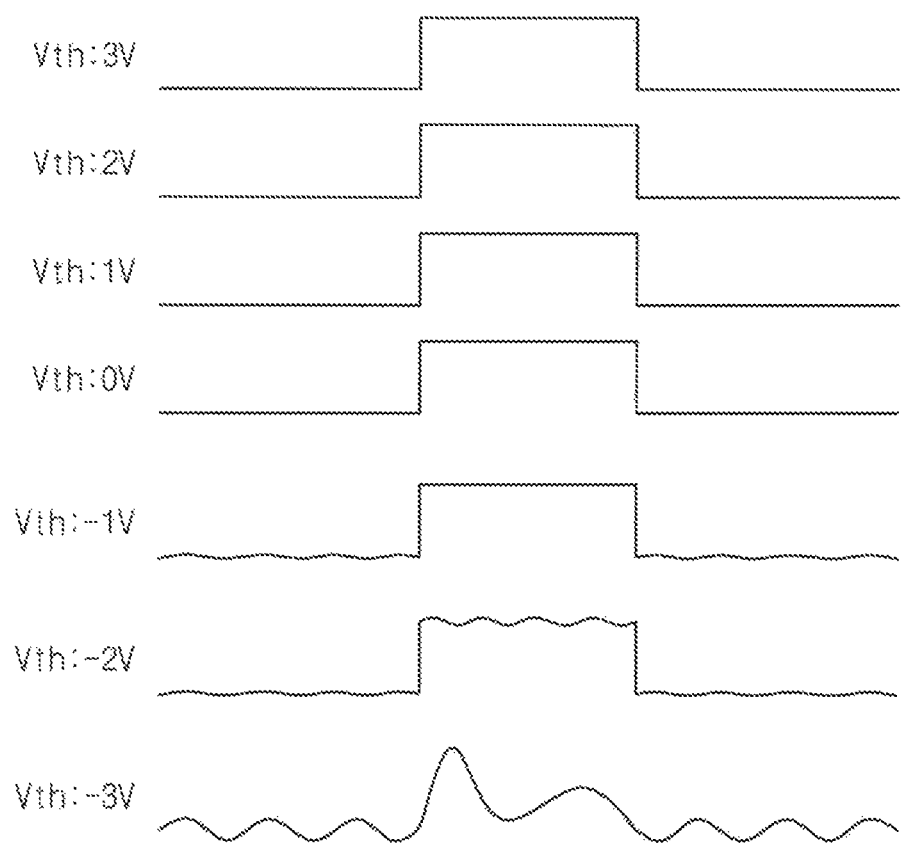
FIGS. 9A and 9B are waveforms for describing an effect of a stage of FIG. 8.
Figure 9B:
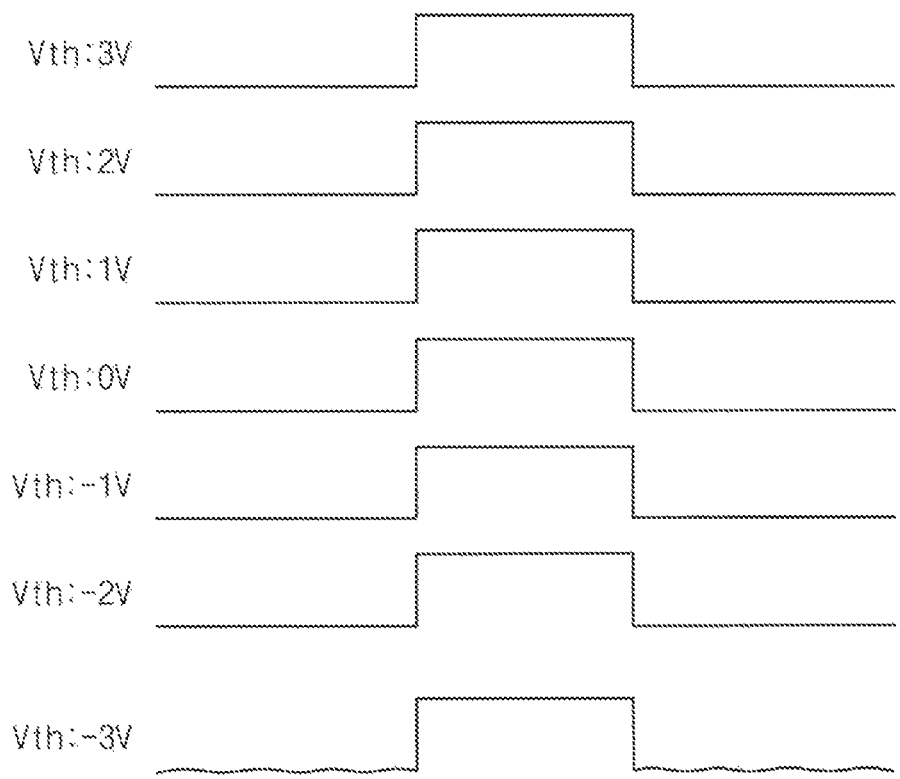

FIGS. 9A and 9B are waveforms for describing an effect of a stage of FIG. 8.

FIGS. 9A and 9B illustrate an effect of a stage wherein each part (e.g., the first input circuit and the stabilizing circuit) of the stage in which the leakage current occurs includes two transistors connected to each other in series, and then a leakage current blocking circuit applies high level voltage to the node between two transistors, thereby preventing or reducing the leakage current.

As shown in FIG. 9A, in an exemplary case where a stage does not include the leakage current blocking circuit, the gate output signal has a ripple or the gate output signal is abnormally outputted when threshold voltages of transistors are less than or equal to −1V (e.g., more negative than −1V). Thus, when the threshold voltages of transistors move in the negative direction, the gate output signal has a ripple or the gate output signal is abnormally outputted. Accordingly, images displayed by the display device have spots or the display device abnormally displays images.

On the other hand, as shown in FIG. 9B, in an exemplary case where each of the first input circuit and the stabilizing circuit includes two transistors that are connected to each other in series and the leakage current blocking circuit applies the high level voltage to node between the two transistors, the gate output signal only begins to have a ripple when threshold voltages of transistors are less than or equal to −3V (e.g., more negative than −3V). Thus, as shown in [TABLE 1], the gate output signal is stably outputted when the threshold voltages of transistors are greater than or equal to −2V (e.g., less negative than −2V).

TABLE 1

| Vth | REF | | STGC | |
|---|---|---|---|---|
| | G HIGH | GLOW | G HIGH | GLOW |
| 5 | −2 | 34 | −2 | 34 |
| 4 | −2 | 34 | −2 | 34 |
| 3 | −2 | 34 | −2 | 34 |
| 2 | −2 | 34 | −2 | 34 |
| 1 | −2 | 34 | −2 | 34 |
| 0 | −1.92 | 34 | −2 | 34 |
| −1 | −1.68 | 33.5 | −1.96 | 34 |
| −2 | −1.32 | 33.0 | −1.74 | 34 |
| −3 | −0.84 | 32.2 | −1.35 | 33.5 |
| −4 | −0.07 | 30.6 | −0.74 | 32.8 |
| −5 | X | X | 0.35 | 32.1 | where, REF indicates a stage not including the leakage current blocking circuit, STGC indicates a stage described in FIG. 8, Vth indicates a threshold voltage of transistor in the stage, G HIGH indicates a voltage of a gate output signal corresponding to high level, and G LOW indicates a voltage of the gate output signal corresponding to low level.

Figure 10:
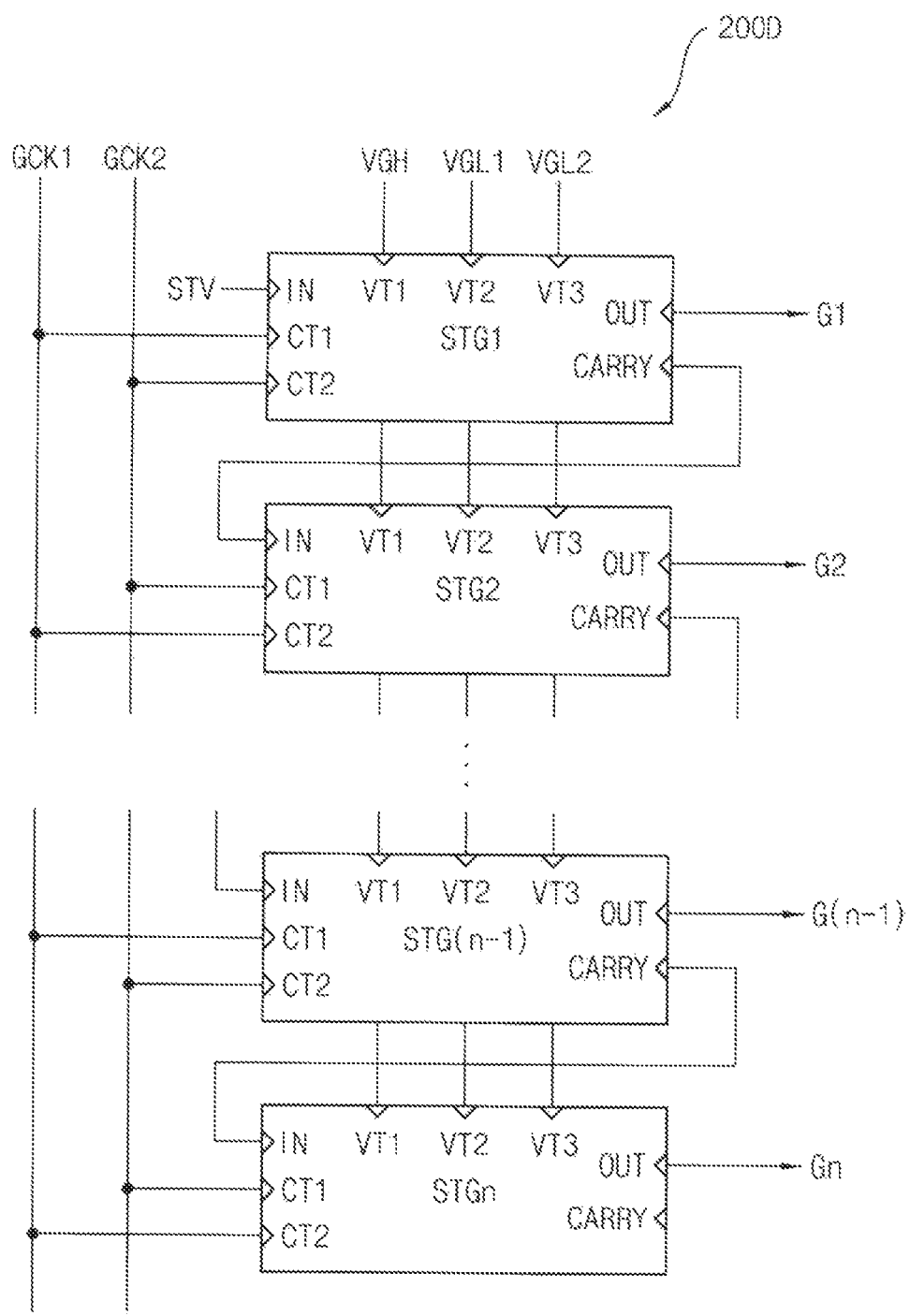
FIG. 10 is a block diagram illustrating still another example of a gate driver included in a display device of FIG. 1.

FIG. 10 is a block diagram illustrating still another example of a gate driver included in a display device of FIG. 1.

Referring to FIG. 10, the gate driver 200D may include a plurality of stages STG1 through STGn. Each of the stages STG1 through STGn may include an input terminal IN, a first clock terminal CT1, a second clock terminal CT2, a first voltage terminal VT1, a second voltage terminal VT2, a third voltage terminal VT3, an output terminal OUT, and a carry terminal CARRY. The gate driver 200D according to the present exemplary embodiment is substantially the same as the gate driver of the exemplary embodiment described in FIG. 7, except that the carry terminal CARRY is added. Therefore, the same reference numerals will be used to refer to the same or like parts as those described in the previous exemplary embodiment of FIG. 7 and any repetitive explanation concerning the above elements will be omitted.

An input signal may be applied to the input terminal IN. For example, the input signal may be a vertical start signal STV or a previous carry signal outputted from one of the previous stages. Thus, the vertical start signal STV is applied to the input terminal IN of the first stage STG1. The previous carry signal of the preceding stage may be respectively applied to each input terminal IN of the others stages SRC2 through SRCn.

The gate output signal may be outputted to the gate line via the output terminal OUT. The carry signal may be outputted to the next stage via the carry terminal CARRY.

Figure 11:
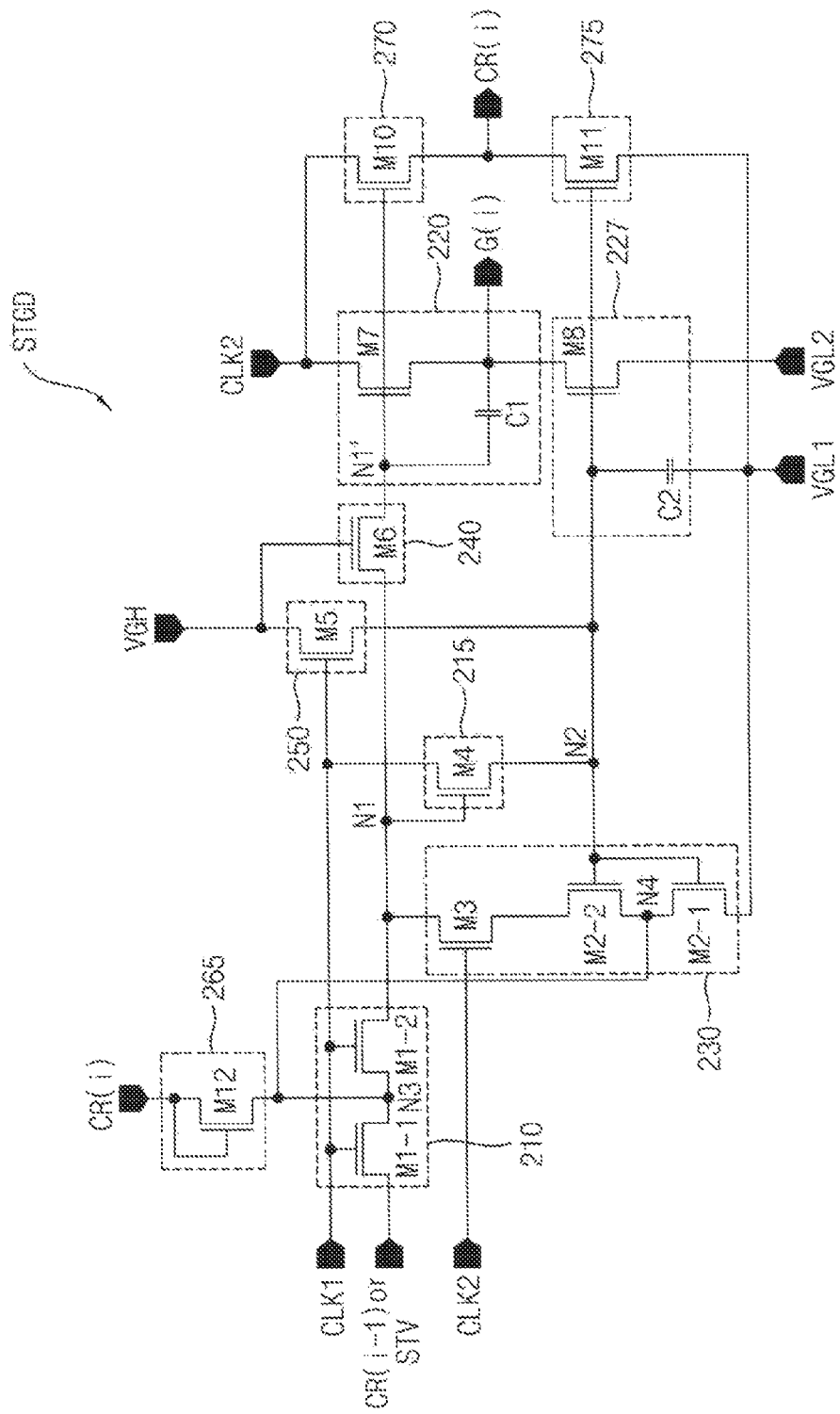
FIG. 11 is a circuit diagram illustrating one example of a stage included in a gate driver of FIG. 10.

FIG. 11 is a circuit diagram illustrating one example of a stage included in a gate driver of FIG. 10.

Referring to FIG. 11, a stage STGD of the gate driver may include a first input circuit 210, a second input circuit 215, a first output circuit 220, a second output circuit 227, a stabilizing circuit 230, a load reducing circuit 240, a holding circuit 250, a first carry output circuit 270, a second carry output circuit 275, and a leakage current blocking circuit 265. The stage STGD according to the present exemplary embodiment is substantially the same as the stage of the exemplary embodiment described in FIG. 8, except that the first and second carry output circuits 270 and 275 are added and the leakage current blocking circuit 265 receives the carry signal. Therefore, the same reference numerals will be used to refer to the same or like parts as those described in the previous exemplary embodiment of FIG. 8 and any repetitive explanation concerning the above elements will be omitted.

The first carry output circuit 270 may control a carry signal to the first logic level in response to the voltage of the first node N1. In one example embodiment, the first carry output circuit 270 may include a first carry output transistor M10. The first carry output transistor M10 may include a gate electrode receiving the voltage of the first node N1, a first electrode receiving a second clock signal CLK2, and a second electrode connected to a carry output terminal to which the carry signal CR(i) is outputted.

The second carry output circuit 275 may control the carry signal to the second logic level in response to the voltage of the second node N2. In one example embodiment, the second carry output circuit 275 may include a second carry output transistor M11. The second carry output transistor M11 may include a gate electrode connected to the second node N2, a first electrode receiving the second power voltage VGL1, and a second electrode connected to the carry output terminal.

The stage STGD may output the gate output signal G(i) and the carry signal CR(i). The stage STGD may provide the carry signal CR(i) instead of the gate output signal G(i) to the next stage. Thus, the carry signal CR(i) may be used as the input signal of next stage or feedback signal to reduce a rising time and a falling time of the gate output signal G(i) and to stably output the gate output signal G(i). In addition, size of the carry output transistors M10 and M11 may be smaller than size of the output transistor M7 and M8 because the carry signal CR(i) may be used as the input signal of next stage or feedback signal. For example, each width of the first and second carry output transistors M10 and M11 may be about 90 micrometer.

The first input circuit 210 may include a plurality of transistors that are connected to each other in series. Therefore, the first input circuit 210 may reduce the leakage current flowing from the first node N1 to the input terminal when the carry signal CR(i) corresponds to high level voltage. In one example embodiment, the first input circuit 210 may include a first input transistor M1-1 and a second input transistor M1-2. The first input transistor M1-1 may include a gate electrode receiving the first clock signal CLK1, a first electrode receiving the input signal, and a second electrode connected to a third node N3. The second input transistor M1-2 may include a gate electrode receiving the first clock signal CLK1, a first electrode connected to the third node N3, and a second electrode connected to the first node N1.

The stabilizing circuit 230 may stabilize the gate output signal G(i) in response to the voltage of the second node N2 and the second clock signal CLK2. The stabilizing circuit 230 may include a plurality of transistors connected to each other in series so as to reduce the leakage current flowing from the first node N1 to the second voltage terminal when the carry signal CR(i) corresponds to high level voltage. In one example embodiment, the stabilizing circuit 230 may include a first stabilizing transistor M2-1, a second stabilizing transistor M2-2, and a third stabilizing transistor M3. The first stabilizing transistor M2-1 may include a gate electrode connected to the second node N2, a first electrode receiving a second power voltage VGL1, and a second electrode connected to a fourth node N4. The second stabilizing transistor M2-2 may include a gate electrode connected to the second node N2, a first electrode connected to the fourth node N4, and a second electrode connected to the first electrode of the third stabilizing transistor M3. The third stabilizing transistor M3 may include a gate electrode receiving the second clock signal CLK2, a first electrode connected to the second electrode of the second stabilizing transistor M2-2, and a second electrode connected to the first node N1.

The leakage current blocking circuit 265 may apply the carry signal CR(i) to at least one of the first input circuit 210 and the stabilizing circuit 230 in response to the carry signal CR(i). In one example embodiment, the leakage current blocking circuit 265 may include a second blocking transistor M12. The second blocking transistor M12 may include a gate electrode receiving the carry signal CR(i), a first electrode receiving the carry signal CR(i), and a second electrode connected to the third node N3 and the fourth node N4. The leakage current blocking circuit 265 may control a voltage of the third node N3 to the high level voltage so as to prevent or reduce the leakage current flowing from the first node N1 to the input terminal when the carry signal CR(i) corresponds to high level voltage. Also, the leakage current blocking circuit 265 may control a voltage of the fourth node N4 to the high level voltage so as to prevent or reduce the leakage current flowing from the first node N1 to the second voltage terminal when the carry signal CR(i) corresponds to high level voltage.

Figure 12A:
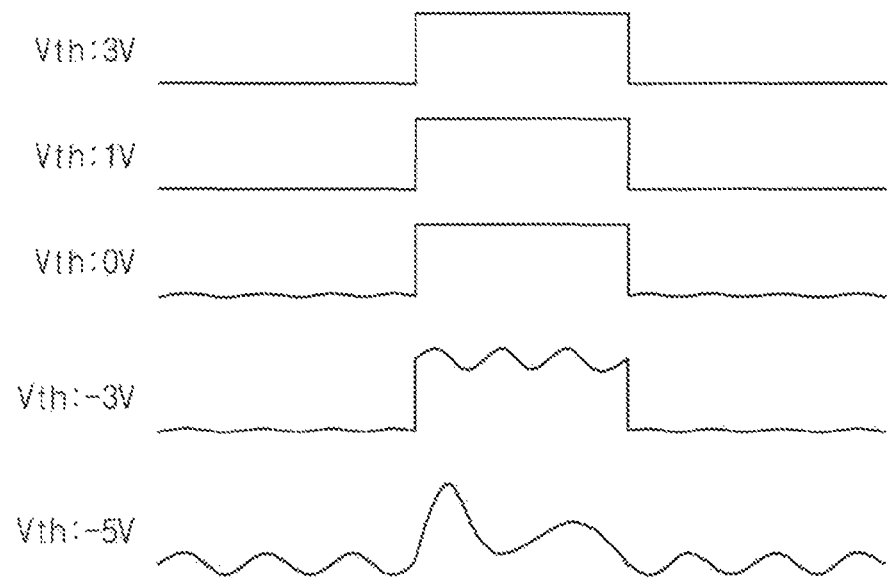
FIGS. 12A and 12B are waveforms for describing an effect of a stage of FIG. 11.
Figure 12B:
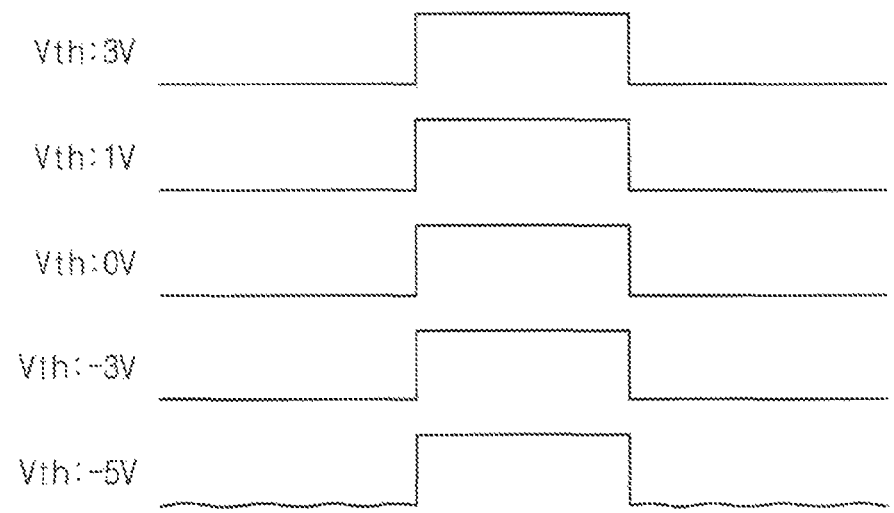

FIGS. 12A and 12B are waveforms for describing an effect of a stage of FIG. 11.

FIGS. 12A and 12B illustrate an effect of a stage wherein each part (e.g., the first input circuit and the stabilizing circuit) of the stage in which the leakage current occurs includes two transistors connected to each other in series, and then a leakage current blocking circuit applies high level voltage to the node between two transistors in response to the carry signal having high level, thereby preventing or reducing the leakage current.

As shown in FIG. 12A, in an exemplary case where a stage does not include the leakage current blocking circuit, the gate output signal has a ripple or the gate output signal is abnormally outputted when threshold voltages of transistors are less than or equal to 0V (e.g., more negative than 0V).

On the other hand, as shown in FIG. 12B, in an exemplary case where each of the first input circuit and the stabilizing circuit includes two transistors that are connected to each other in series and the leakage current blocking circuit applies the high level voltage to node between the two transistors, the gate output signal only begins to have a ripple when threshold voltages of transistors are less than or equal to −4V (e.g., more negative than −4V). Thus, as shown in [TABLE 2], the gate output signal is stably outputted when the threshold voltages of transistors are greater than or equal to −3V (e.g., less negative than −3V).

TABLE 2

| Vth | REF | | STGD | |
|---|---|---|---|---|
| | G HIGH | G LOW | G HIGH | G LOW |
| 5 | −2 | 38 | −2 | 38 |
| 4 | −2 | 38 | −2 | 38 |
| 3 | −2 | 38 | −2 | 38 |
| 2 | −2 | 38 | −2 | 38 |
| 1 | −2 | 38 | −2 | 38 |
| 0 | −1.97 | 38 | −2 | 38 |
| −1 | −1.88 | 37.6 | −2 | 38 |
| −2 | −1.76 | 37.1 | −2 | 38 |
| −3 | −1.61 | 35.1 | −2 | 38 |
| −4 | X | X | −2 | 37.8 |
| −5 | X | X | −1.46 | 37.5 | where, REF indicates a stage not including the leakage current blocking circuit, STGD indicates a stage described in FIG. 11, Vth indicates a threshold voltage of transistor in the stage, G HIGH indicates a voltage of a gate output signal corresponding to high level, and G LOW indicates a voltage of the gate output signal corresponding to low level.

Although a gate driver and a display device having the gate driver according to example embodiments have been described with reference to the figures, those skilled in the art will readily appreciate that many modifications are possible in the example embodiments without materially departing from the novel teachings and features of the present disclosure. For example, although the example embodiments describe that the leakage current blocking circuit applies high level voltage to the stabilizing circuit or/and the first input circuit, each part of each stage in which the leakage current occurs includes two transistors connected to each other in series and the leakage current blocking circuit applies high level voltage to the node between two transistors in each part. In addition, although the example embodiments describe that each stage includes n-channel metal oxide semiconductor (NMOS)-type transistors, a type of transistor is not limited thereto. For example, embodiments may include p-channel metal oxide semiconductor (PMOS)-type transistors in each stage.

The present disclosure may be applied to an electronic device having a display device. For example, the present disclosure may be applied to a cellular phone, a smart phone, a smart pad, a personal digital assistant (PDA), etc.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The foregoing is illustrative of example embodiments and is not to be construed as limiting thereof. Although a few example embodiments have been described, those skilled in the art will readily appreciate that many modifications are possible in the example embodiments without materially departing from the novel teachings and features of the present disclosure. Accordingly, all such modifications are intended to be included within the scope of the present disclosure. Therefore, it is to be understood that the foregoing is illustrative of various example embodiments and is not to be construed as limited to the specific example embodiments disclosed, and that modifications to the disclosed example embodiments, as well as other example embodiments, and equivalents thereof, are intended to be included within the scope of the appended claims.

What is claimed is:

1. A gate driver comprising a plurality of stages configured to output a plurality of gate output signals, each stage comprising:
   a first input circuit configured to receive one of a previous gate output signal from a preceding stage or a vertical start signal as an input signal and to apply the input signal to a first node in response to a first clock signal;
   a second input circuit configured to apply the first clock signal to a second node in response to a voltage of the first node;
   a first output circuit configured to control a gate output signal to a first logic level in response to the voltage of the first node;
   a second output circuit configured to control the gate output signal to a second logic level in response to a voltage of the second node; and
   a leakage current blocking circuit configured to apply a first power voltage corresponding to the first logic level to the first input circuit in response to the voltage of the first node.

2. The gate driver of claim 1, wherein the first input circuit includes:
   a first input transistor including a gate electrode configured to receive the first clock signal, a first electrode configured to receive the input signal, and a second electrode connected to a third node; and
   a second input transistor including a gate electrode configured to receive the first clock signal, a first electrode connected to the third node, and a second electrode connected to the first node.

3. The gate driver of claim 2, wherein the leakage current blocking circuit includes:
   a first blocking transistor including a gate electrode connected to the first node, a first electrode configured to receive the first power voltage, and a second electrode connected to the third node.

4. The gate driver of claim 1, wherein each stage further includes:
   a stabilizing circuit configured to stabilize the gate output signal in response to the voltage of the second node and the second clock signal, and
   wherein the stabilizing circuit includes:
   a first stabilizing transistor including a gate electrode connected to the second node, a first electrode configured to receive a second power voltage, and a second electrode connected to a fourth node;
   a second stabilizing transistor including a gate electrode connected to the second node, a first electrode connected to the fourth node, and a second electrode; and
   a third stabilizing transistor including a gate electrode configured to receive the second clock signal, a first electrode connected to the second electrode of the second stabilizing transistor, and a second electrode connected to the first node.

5. The gate driver of claim 4, wherein the leakage current blocking circuit includes:
   a first blocking transistor including a gate electrode connected to the first node, a first electrode configured to receive the first power voltage, and a second electrode connected to the fourth node.

6. The gate driver of claim 4, wherein the first output circuit includes:
   a first output transistor including a gate electrode configured to receive the voltage of the first node, a first electrode configured to receive the second clock signal, and a second electrode connected to an output terminal to which the gate output signal is outputted, and
   wherein the second output circuit includes:
   a second output transistor including a gate electrode connected to the second node, a first electrode configured to receive a third power voltage, and a second electrode connected to the output terminal.

7. The gate driver of claim 6, wherein the third power voltage is higher than the second power voltage.

8. The gate driver of claim 7, wherein a first width-to-length ratio of the first output transistor is smaller than a second width-to-length ratio of the second output transistor.

9. The gate driver of claim 4, wherein the second output circuit includes:
   a third output transistor including a gate electrode connected to the second node, a first electrode configured to receive the second power voltage, and a second electrode connected to a fifth node; and
   a fourth output transistor including a gate electrode connected to the second node, a first electrode connected to the fifth node, and a second electrode connected to an output terminal to which the gate output signal is outputted.

10. The gate driver of claim 9, wherein the leakage current blocking circuit includes:
    a first blocking transistor including a gate electrode connected to the first node, a first electrode receiving the first power voltage, and a second electrode connected to the fifth node.

11. The gate driver of claim 1, wherein each stage further includes:
    a holding circuit configured to maintain a voltage of the second node as the first logic level in response to the first clock signal.

12. The gate driver of claim 1, wherein each stage further includes:
    a load reducing circuit connected between the first input circuit and the first output circuit and configured to prevent the voltage of the first node from increasing above the first power voltage.

13. A gate driver comprising a plurality of stages configured to output a plurality of gate output signals and a plurality of carry signals, each stage comprising:
    a first input circuit configured to receive one of a previous carry signal from a preceding stage or a vertical start signal as an input signal and to apply the input signal to a first node in response to a first clock signal;

a second input circuit configured to apply the first clock signal to a second node in response to a voltage of the first node;

a first output circuit configured to control a gate output signal to a first logic level in response to the voltage of the first node;

a second output circuit configured to control the gate output signal to a second logic level in response to a voltage of the second node;

a first carry output circuit configured to control a carry signal to the first logic level in response to the voltage of the first node;

a second carry output circuit configured to control the carry signal to the second logic level in response to the voltage of the second node; and a leakage current blocking circuit configured to apply the carry signal to the first input circuit in response to the carry signal.

14. The gate driver of claim 13, wherein the first input circuit includes:

a first input transistor including a gate electrode configured to receive the first clock signal, a first electrode configured to receive the input signal, and a second electrode connected to a third node; and a second input transistor including a gate electrode configured to receive the first clock signal, a first electrode connected to the third node, and a second electrode connected to the first node.

15. The gate driver of claim 14, wherein the leakage current blocking circuit includes:

a second blocking transistor including a gate electrode configured to receive the carry signal, a first electrode receiving the carry signal, and a second electrode connected to the third node.

16. The gate driver of claim 13, wherein each stage further includes:

a stabilizing circuit configured to stabilize the gate output signal in response to the voltage of the second node and the second clock signal, and wherein the stabilizing circuit includes:

a first stabilizing transistor including a gate electrode connected to the second node, a first electrode configured to receive a second power voltage, and a second electrode connected to a fourth node;

a second stabilizing transistor including a gate electrode connected to the second node, a first electrode connected to the fourth node, and a second electrode; and a third stabilizing transistor including a gate electrode configured to receive the second clock signal, a first electrode connected to the second electrode of the second stabilizing transistor, and a second electrode connected to the first node.

17. The gate driver of claim 16, wherein the leakage current blocking circuit includes:

a second blocking transistor including a gate electrode configured to receive the carry signal, a first electrode configured to receive the carry signal, and a second electrode connected to the fourth node.

18. The gate driver of claim 16, wherein the first output circuit includes:

a first output transistor including a gate electrode configured to receive the voltage of the first node, a first electrode configured to receive the second clock signal, and a second electrode connected to an output terminal to which the gate output signal is outputted, wherein the second output circuit includes:

a second output transistor including a gate electrode connected to the second node, a first electrode configured to receive a third power voltage, and a second electrode connected to the output terminal, wherein the first carry output circuit includes:

a first carry output transistor including a gate electrode configured to receive the voltage of the first node, a first electrode configured to receive a second clock signal, and a second electrode connected to a carry output terminal to which the carry signal is outputted, and wherein the second carry output circuit includes:

a second carry output transistor including a gate electrode connected to the second node, a first electrode configured to receive the second power voltage, and a second electrode connected to the carry output terminal.

19. The gate driver of claim 18, wherein the third power voltage is higher than the second power voltage.

20. A display device comprising:

a display panel including a plurality of gate lines, a plurality of data lines, and a plurality of pixels;

a data driver configured to provide data signals to the pixels via the data lines; and a gate driver including a plurality of stages configured to output a plurality of gate output signals and to provide the gate output signals to the pixels via the gate lines;

wherein each stage of the gate driver includes:

a first input circuit configured to receive one of a previous gate output signal from a preceding stage or a vertical start signal as an input signal and to apply the input signal to a first node in response to a first clock signal;

a second input circuit configured to apply the first clock signal to a second node in response to a voltage of the first node;

a first output circuit configured to control a gate output signal to a first logic level in response to the voltage of the first node;

a second output circuit configured to control the gate output signal to a second logic level in response to a voltage of the second node;

a stabilizing circuit configured to stabilize the gate output signal in response to the voltage of the second node and the second clock signal, and a leakage current blocking circuit configured to apply a first power voltage corresponding to the first logic level to at least one of the first input circuit and the stabilizing circuit in response to the voltage of the first node.

* * * * *